(12) United States Patent  
Clidaras et al.

(10) Patent No.: US 10,136,561 B2  
(45) Date of Patent: Nov. 20, 2018

(54) TARGETED COOLING FOR DATACENTERS

(71) Applicant: Google Inc., Mountain View, CA (US)

(72) Inventors: Jimmy Clidaras, Los Altos, CA (US); Winnie Leung, Palo Alto, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 14/725,214

(22) Filed: May 29, 2015

(65) Prior Publication Data

US 2015/0264837 A1    Sep. 17, 2015

Related U.S. Application Data

(63) Continuation of application No. 11/679,024, filed on Feb. 26, 2007, now Pat. No. 9,060,451.

(51) Int. Cl.  
*H05K 7/20* (2006.01)

(52) U.S. Cl.  
CPC ..... *H05K 7/20754* (2013.01); *H05K 7/20745* (2013.01); *H05K 7/20836* (2013.01)

(58) Field of Classification Search  
CPC .............................. H05K 7/20; H05K 7/20754  
USPC .................................................. 454/184, 187  
See application file for complete search history.

(56) References Cited

U.S. PATENT DOCUMENTS

| | | | | |
|---|---|---|---|---|
| 6,441,748 B1* | 8/2002 | Takagi | ............. | G08G 1/096716 324/634 |
| 6,535,382 B2* | 3/2003 | Bishop | ............... | H05K 7/20736 312/223.1 |
| 2002/0149911 A1* | 10/2002 | Bishop | ............... | H05K 7/20736 361/690 |
| 2003/0033886 A1* | 2/2003 | Davie | ..................... | F16K 41/02 73/780 |
| 2003/0042688 A1* | 3/2003 | Davie | .................... | F16J 15/061 277/590 |
| 2003/0050003 A1 | 3/2003 | Charron | | |
| 2004/0004419 A1* | 1/2004 | Godlewski | ............ | A47B 63/06 312/297 |
| 2004/0100770 A1 | 5/2004 | Chu et al. | | |
| 2004/0264124 A1* | 12/2004 | Patel | ........................ | G06F 1/20 361/679.46 |
| 2005/0013096 A1* | 1/2005 | Barsun | .................... | G06F 1/181 361/679.57 |
| 2005/0153649 A1* | 7/2005 | Bettridge | .................. | F24F 9/00 454/188 |
| 2005/0170770 A1 | 8/2005 | Johnson et al. | | |
| 2005/0225936 A1* | 10/2005 | Day | .................. | H05K 7/20754 361/679.47 |
| 2005/0237716 A1 | 10/2005 | Chu et al. | | |
| 2005/0248043 A1* | 11/2005 | Bettridge | .................. | F24F 9/00 261/27 |
| 2008/0204999 A1 | 8/2008 | Clidaras et al. | | |

* cited by examiner

*Primary Examiner* — Steven B McAllister  
*Assistant Examiner* — Samantha Probst  
(74) *Attorney, Agent, or Firm* — Fish & Richardson P.C.

(57) ABSTRACT

A method of cooling electronic equipment is disclosed and includes substantially continuously circulating ambient air across a plurality of rack-mounted electronic devices, monitoring the temperature of air in or around a group of devices in the plurality of rack-mounted electronic devices, and providing substantially cooler-than-ambient air to the group of devices when the monitored air temperatures rises above a set value.

20 Claims, 4 Drawing Sheets

TARGETED COOLING FOR DATACENTERS

CROSS-REFERENCE TO RELATED APPLICATION

This application is a continuation of, and claims priority under 35 U.S.C. § 120 to, U.S. patent application Ser. No. 11/679,024, entitled "Targeted Cooling for Datacenters" and filed on Feb. 26, 2007, the entire contents of which are incorporated herein by reference.

TECHNICAL FIELD

This document relates to systems and methods for providing cooling for areas containing electronic equipment, such as computer server rooms and server racks in computer data centers.

BACKGROUND

Computer users often focus on the speed of computer microprocessors (e.g., megahertz and gigahertz). Many forget that this speed often comes with a cost—higher electrical consumption. For one or two home PCs, this extra power may be negligible when compared to the cost of running the many other electrical appliances in a home. But in data center applications, where thousands of microprocessors may be operated, electrical power requirements can be very important.

Power consumption is also, in effect, a double whammy. Not only must a data center operator pay for electricity to operate its many computers, but the operator must also pay to cool the computers. That is because, by simple laws of physics, all the power has to go somewhere, and that somewhere is, for the most part, conversion into heat. A pair of microprocessors mounted on a single motherboard can draw 200-400 watts or more of power. Multiply that figure by several thousand (or tens of thousands) to account for the many computers in a large data center, and one can readily appreciate the amount of heat that can be generated. It is much like having a room filled with thousands of burning floodlights.

Thus, the cost of removing all of the heat can also be a major cost of operating large data centers. That cost typically involves the use of even more energy, in the form of electricity and natural gas, to operate chillers, condensers, pumps, fans, cooling towers, and other related components. Heat removal can also be important because, although microprocessors may not be as sensitive to heat as are people, increases in heat generally can cause great increases in microprocessor errors. In sum, such a system may require electricity to heat the chips, and more electricity to cool the chips.

SUMMARY

This document describes systems and methods that may be employed to remove heat efficiently from areas storing electronic equipment, such as data centers.

In one implementation, a method of cooling electronic equipment is disclosed. The method includes circulating ambient air across a plurality of rack-mounted electronic devices, monitoring the temperature of air in or around a group of devices in the plurality of rack-mounted electronic devices, and providing substantially cooler-than-ambient air to the group of devices when a high cooling load is sensed for one or more of the rack-mounted electronic devices. The cooler-than-ambient air can be provided by a bank of air distribution wands arrayed upstream from the plurality of rack-mounted electronic devices. Also, the distribution wands can be positioned to provide clearance for wired connections upstream from the rack-mounted electronic devices. The method may also include pivoting one or more of the distribution arms to provide access for removal of one or more rack-mounted electronic devices.

In some aspects, the ambient air can be circulated by individually controlled circulation fans mounted to one or more of the electronic devices. Also, the ambient air can be circulated by fan units located in a common warm-air plenum. The ambient air may be supplied through cooling coils that receive warmed air from a common warm-air plenum. Also, the set value for the method may be a particular temperature value.

In another implementation, a computer cooling system is disclosed. The system includes one or more ambient air circulation fans arranged to circulate air over one or more rack mounted devices in a data center, a sensor located near a rack mounted device to sense a load on the device, and a cooler-than-ambient air distributor near the device and configured to release cooling air over the device. The system may further include a connection at a front side of one of the rack mounted devices. The system may also include a network jack at the front side of one of the rack mounted devices. An air damper controlled by the sensor may also be provided, and the air damper may control a rack of air distributors, such as an air wand. The air wand can be pivotally mounted to a riser duct associated with a rack. In addition, the system may also include a free cooling sub-system to provide cooling for the ambient air, and a refrigerated cooling sub-system to provide cooler-than-ambient air.

In yet another implementation, a computer cooling system comprises one or more ambient air circulation fans arranged to circulate air over one or more rack mounted devices in a data center, a sensor located at a rack mounted device to sense a load on the device, and means for distributing sub-cooled air near the device.

The details of one or more embodiments are set forth in the accompanying drawings and the description below. Other features, objects, and advantages will be apparent from the description and drawings, and from the claims.

DESCRIPTION OF DRAWINGS

Like reference symbols in the various drawings indicate like elements.

DETAILED DESCRIPTION

Figure 1:
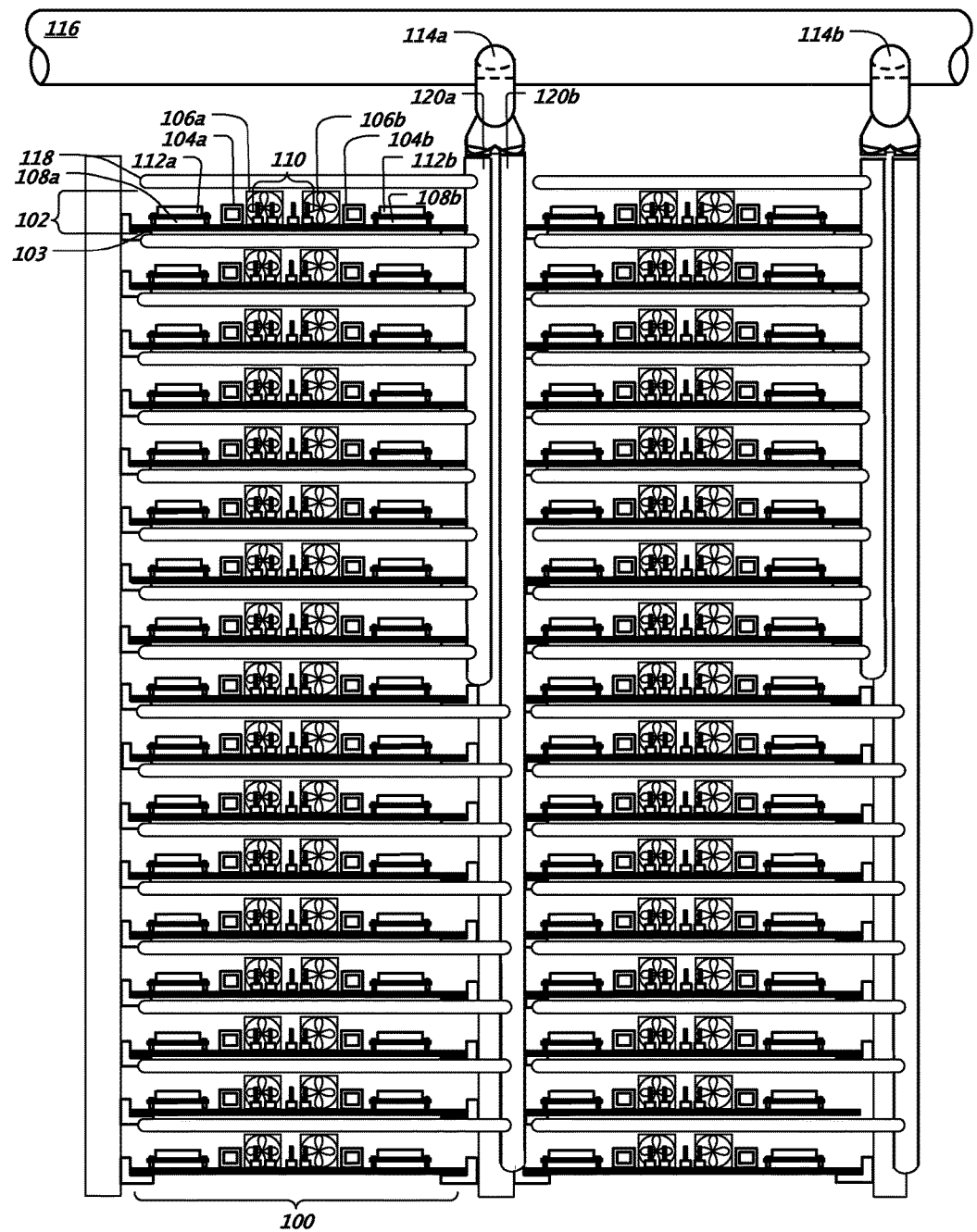
FIG. 1 shows a front view of a pair of data center racks.

FIG. 1 shows a front view of a pair of data center racks 100. In general, the data center racks 100 carry a number of motherboard assemblies in a horizontal fashion, much like lunch trays on a cafeteria rack. The racks may be open at their fronts to a data center room, and ambient air may be pulled across the racks to cool electronic equipment. When hot spots arise, spot cooling with much cooler-than-ambient air may be provided at each tray or at each rack, as described below. Such spot cooling may advantageously permit for finer-tuned control over cooling. As a result, a data center may be cooled with relatively warm ambient air for the most part, and cooled air may be used only in particular situations. Therefore, cooling costs may be substantially decreased for operating a data center, and such reduced costs may be significant when the data center contains thousands of trays.

Also, cooling for transient conditions may also be provided relatively economically. For example, a data center may see a spike in demand predictably at certain times of the day. A sub-cooled system may be turned on just before such a spike and provide cooling throughout the spike to prevent overheating of trays in the system. In certain situations, the extra cooling may be provided for a time period short enough to prevent the creation of damaging condensation on components in the system.

Any number of racks may be arrayed within a data center. The racks may be arranged as a number of vertical stacks of computing units, where each stack is similar to the other stacks. The racks may be arranged in a plurality of rows, including by placing pairs of rows of racks back-to-back in a data center. The racks may have fronts that are open to the workspace in the data center, and may pull air from the workspace across the electronic components on the racks. The air may then be directed into a common warm-air plenum, such as in a space between and behind connected pairs of back-to-back rows of racks.

Each rack may hold several dozen trays, such as tray 102, on which are mounted various computer components. The trays may simply be held into position on ledges in each rack, and may be stacked one over the other. The spacing of the individual trays may be made as close as is practical, given the size of the components on each tray and the need for air circulation around each tray. The spacing may be uniform so as to permit easy swapping of trays, or may vary, with certain types of trays (e.g., for storage) being placed in a certain spacing and others (e.g., server processors) placed in a different spacing.

Individual trays may be removed from a rack, or an entire rack may be moved into or out of a data center. For example, trays may be connected to electrical or cooling connections, such as at their back edges, and may also be connected to network connections, such as at their front edges. The connections may be removed either before or after a tray has been partially slid out of a rack, and the tray may be fully removed once all connections have been removed.

The term "tray" is not limited to any particular arrangement, but instead includes any arrangement of computer-related components coupled together to serve a particular purpose, such as on a motherboard. Trays may be generally mounted parallel to other trays in a horizontal or vertical stack, so as to permit denser packing than would otherwise be possible with computers having free-standing housings and other components. Trays may be implemented in particular configurations, including as computer servers, switches (e.g., electrical and optical), routers, storage drives or groups of drives or other storage structures, and other computing-related devices. In general, the trays in a system take a standardized physical and electrical form to be easily interchangeable from one location in the system to another, but the trays may take other appropriate forms.

In operation, tray 102 may be mounted flat horizontally in a server rack such as by sliding tray 102 into the rack from the rack front, and over a pair of rails in the rack on opposed sides of the tray 102—much like sliding a lunch tray into a cafeteria rack. Tray 102 may alternatively be mounted vertically, such as in a bank of trays mounted at one level in a rack. The front of the rack may be kept open to permit easy access to, and replacement of, trays and to permit for air to flow over the tray 102 from a workspace where technicians or other professionals operating a data center may be located. In this context, the term workspace is intended to refer to areas in which technicians or others may normally be located to work on computers in a data center.

In general, the tray 102 may include a standard circuit board 103 on which a variety of components are mounted. The board 103 may be arranged so that air is routed over a number of heat generating components on the board 103 and is drawn through a power supply (not shown) mounted behind a pair of fans 106a, 106b near the back of each tray, before being exhausted from the tray 102, such as into a common warm-air plenum. The fans 106a, 106b may also be arranged to push air through the power supplies. In addition, components may be mounted on the board 103 in a particular order from front to back, for example, so that the components having the highest capability to handle high temperatures are located near the back, or so that components emitting the most heat are located near the back.

The board 103 may hold a variety of components needed in a computer system. As shown, the board 103 holds a microprocessor computer system that uses microprocessors 108a, 108b connected to banks of memory 110. The memory 110 may be in the form, for example, of a number of single in-line memory modules (SIMMs), dual in-line memory module (DIMMs), or other appropriate form. Other components of the computer system, such as chip sets and other chips, have been omitted for clarity in the figure, and may be selected and arranged in any appropriate manner. In addition, network connectors 104a, 104b may also be provided, such as optical connectors or RJ-45 connectors for connection on the front of board 103.

Although tray 102 is shown in FIG. 1 to include a processor-based computer system, other arrangements may be appropriate for other trays. For example tray 102 may include only hard drives and associated circuitry if the purpose of the tray is for storage. Also, tray 102 may be provided with expansion cards such as by use of a horizontally mounted riser module. Although particular forms of tray 102 may be provided, certain advantages may be achieved in appropriate circumstances by the use of common trays. In particular, great efficiencies may be gained by standardizing on one or a small handful of tray forms so as to make interaction between trays more predictable, and to lower the need to track and store many different kinds of trays.

A data center may be made up of numerous (hundreds or thousands) trays, each mounted in one of numerous racks. For example, several dozen trays may be mounted in a single rack within a space, with approximately several inches between each tray. As noted above, each of the trays in a rack may back up to a warm air plenum that receives exhaust air from the trays and routes that air to a cooling unit that may re-circulate the air into the workspace in front of the racks.

Trays may also be packaged in groups. For example, two stacked trays may be matched as a pair, with one fan 106 serving both trays. Specifically, the fans 106 may be approximately double the height and diameter of a single tray unit, and may extend from the lower tray in a pair up to the top of the upper tray in a pair (not shown). By such an arrangement, the slowest turning portions of the fan, in the fan center, will be near the board of the top tray, where less airflow will normally occur because of boundary layer effects. The larger and faster moving portions of the fan 106 will be located nearer to the free areas of each tray 102 so as to more efficiently move air over the trays and through the respective power supplies more freely. In addition, a double-height fan may be able to move more air than can a single-height fan, at lower rotation speeds. As a result, a fan in such an arrangement may produce less noise, or noise at a more tolerable frequency, than could a smaller fan. Parallel fans may also be used to increase flow, and serial fans may be used to increase pressure, where appropriate.

The microprocessors 108*a*, 108*b* generate heat as they function. A pair of processor-mounted fans 112*a*, 112*b* draw the heat away, providing cooling via impingement of air onto the top surfaces of the microprocessors 108*a*, 108*b*. In addition, fans 106*a*, 106*b* may provide for the flow of cooling air across board 103. In certain embodiments, the temperature rise across tray 102 may be approximately 20 degrees Celsius. As one example, air may enter the space above the board in tray 102 from a workspace at 25° C., and may exit fan 106 at 45° C. The 45° C. exhaust temperature may be selected as a maximum temperature for which the components in tray 102 can be maintained without significant errors or breakdowns, or a safe temperature of operation. In addition, a minimum fan speed may also be set to ensure continued and sufficient circulation over the components even where the pre-set temperature rise has not been met. Such a minimum setting may help to prevent the creation of localized hot spots on tray 102.

The 25° C. entering temperature may be a temperature determined to create a comfortable or tolerable temperature in the workspace in a data center. The entering temperature may also be linked to a maximum allowable temperature, such as a federal or state OSHA-mandated maximum temperature. The entering temperature could be approximately 40° C., which matches certain limits established by bodies governing workplace safety.

In other implementations, air may enter the space above the board within tray 102 at a temperature of 50° C., where appropriate thermal removal mechanisms or methods are provided for the components on the board. For example, conductive and liquid-cooled components may be placed in contact with microprocessor 108 to increase the rate of heat dissipation from the component. Higher temperatures for expected breakdowns include component case temperatures of 85° C. In addition, the heat rise across tray 102 may be as high as 75° C.

A minimum fan speed or air flow may also be provided for exit fan 106. Such a minimum speed may help ensure that sufficient circulation exists over a tray 102 to prevent the creation of hot spots and the like.

In certain situations, a rack, a group of racks, a board, or a group of boards in a rack or in adjacent racks may generate more heat than can be withdrawn using circulation of ambient air from a workspace. Without additional cooling, the components on tray 102 may overheat and begin to fail. In such situations, additional cooling may be provided in relative low volumes by a separate cooling system. As discussed in more detail below, the separate system may include a powered cooling system that uses chillers, condensers, or other relatively high-energy components, whereas the ambient cooling may be provided by a "free cooling" system that includes, for example, cooling towers but need not include chillers, or may operate chillers only under certain circumstances.

The supplemental cooling air may be supplied through a network of distribution runs, such as supply duct 116, which may take various forms, including a circular tube or pipe (sheet metal or plastic), a rectangular sheet metal duct, or other appropriate form. The air may be supplied at sub-ambient temperature, such as a temperature between 40 and 60 degrees Fahrenheit, so as to provide substantial cooling at a lowered flow rate. The air may be cooled centrally and then distributed throughout a data center, or may be cooled in a distributed manner, such as with cooling coils located throughout a physical plant.

Cooling standpipes 120*a*, 120*b* run up the length of the racks 100. The cooling standpipes 120*a*, 120*b* connect to the supply duct 116 via a common connection 114*a*. The standpipes 120*a*, 120*b* may have air metered to them by a control damper or dampers 204*a*, 204*b* (see FIG. 2). The dampers may be pneumatically or electronically controlled, and may be tied into a central building control system for reporting and/or control.

One or more temperature sensors (not shown) may be located in or near the trays such as tray 102. The temperature sensor(s) may be set to trigger distribution of cool air if the ambient room temperature and/or a rack or tray region temperature cross a temperature threshold (and, in certain circumstances, if the fans 106*a*, 106*b* are operating at a maximum rate). Temperature sensors may be arrayed in any appropriate fashion, for example, one per tray, one per rack, located in a common warm air-plenum, or otherwise.

The temperature sensor output can be fed to a computer program that triggers air distribution in the event of the board temperature crossing a set threshold. Each temperature sensor may be connected in a PID control loop with a damper 204*a*, 204*b*, so that a corresponding damper is opened in proportion with, or in other relationship with, an increase in temperature sensed for a particular area. The temperature sensor may trigger dampers 204*a*, 204*b* to provide cool air in the area of a tray or trays.

Each damper may be controlled in a proportional manner by a sensor. Alternatively, a triggering signal from a sensor may cause a damper to go to full-open. The damper may then modulate according to readings from the sensor (such as after a pre-set period of time at full open state), may return to a closed position after a predetermined time period, or may move steadily from full open to full closed.

As shown in the example in the figures, the control of cooling air is set at a two-per-rack level. In other words, each rack has two cooling zones, where a separate standpipe serves each zone, and a damper is provided on each standpipe. In this manner, relatively localized cooling control may be provided, so that if a board in one part of a rack begins to heat up, supplemental cooling may be provided. Each damper 204*a*, 204*b* may also be connected to multiple temperature sensors, such as one sensor at each tray, and the highest sensed temperature may be selected to drive the operation of the dampers 204*a*, 204*b*. Alternatively, dampers may be provided for each tray, for each rack, for each row of racks, or pair of rows of racks, or other appropriate grouping of equipment. Dampers may also be grouped according to a corresponding load grouping for the trays. For example, if a load management system for a data center allocates work to trays on a rack-wise basis, the cooling may likewise be controlled on a rack-wise basis, under the assumption that the commonly controlled or loaded computers will have similar cooling needs.

Because the supply duct 116 may contain air which has been cooled to 10° C. or below, the area immediately surrounding the supply duct 116 could be near or below the dew point temperature of the surrounding area, so that condensation may begin to form on the outside of the duct 116 and/or standpipes 120a, 120b. Where condensation may be a problem, insulation may be provided around the duct 116 or standpipes 120a, 120b, and other such ducts to prevent such condensation. In one implementation, the supply duct 116 may be situated beneath the data center floor, and floor drains or other collecting apparatuses may be provided to collect and remove moisture building up on the cooling pipes 114 and/or standpipes (which condensation may be expected to drip to the bottom of each standpipe).

To better distribute cooling air across the trays, such as tray 102, cooling wands, such as wand 118, or other appropriate distribution structures may be provided. The cooling wand 118 may be provided with a number of aligned openings, such as small holes or perforations on the side facing the tray 102 so that a relatively even sheet of air is blown across tray 102. The holes may be spaced evenly to provide even cooling, or spaced unevenly to provide higher cooling in areas having warmer components. The holes may be aligned with each other and blow in one direction, or may be aimed in different directions and/or unaligned so as to provide distribution at different angles from the wand 118.

The wands may be located at a position that permits for best cooling of the electronic components on the trays. For example, the wands may be located directly in front of the heat generating components. Alternatively, the wands may be located above or below such a location, and may distribute cooling air at an angle to permit for additional cooling by impingement, and to keep the wands out of the way for removal of the trays. Other arrangements of the wands may also be employed, such as one wand for each pair of adjacent racks with openings in the wand directed upward and downward. As discussed in more detail below, the wands may also be made movable so that they can change the direction in which they distribute air, and may also be moved out of the way of the trays in a system.

Figure 2A:
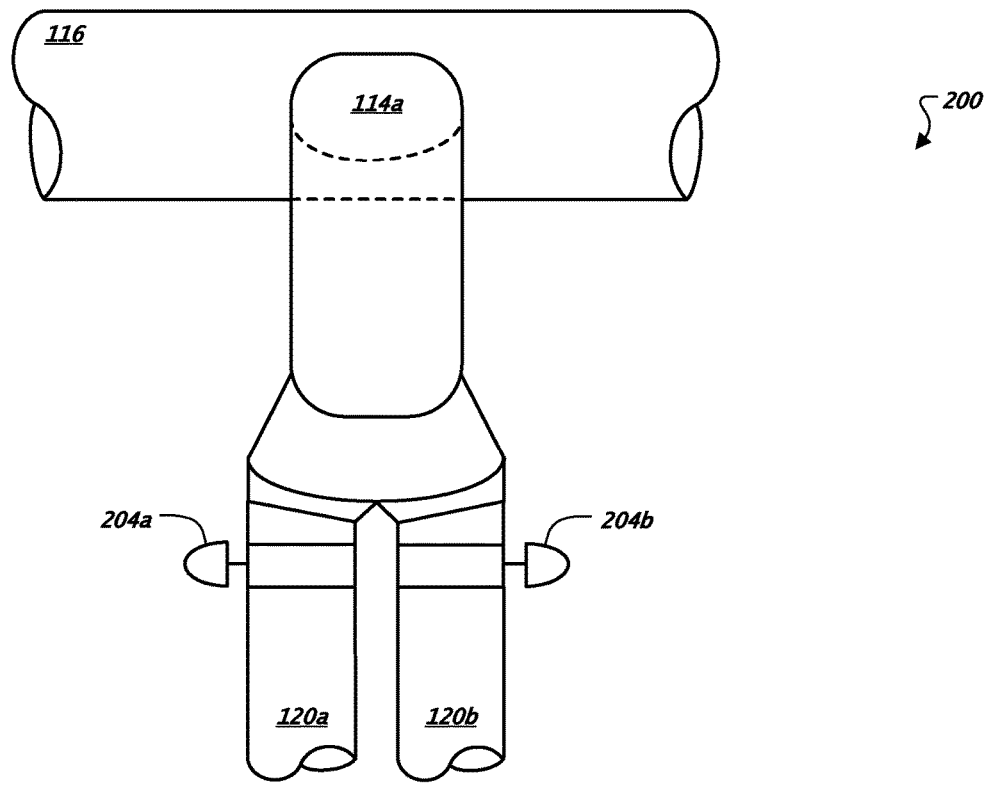
FIG. 2A shows a front view of exemplary cooling ductwork and controls.
Figure 2B:
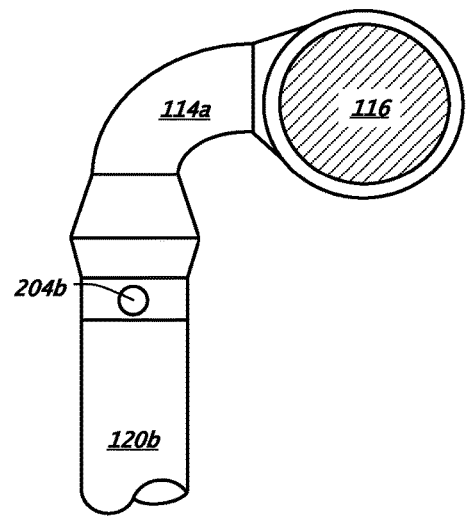
FIG. 2B shows a side view of exemplary cooling ductwork and controls.

FIG. 2A shows a front view of exemplary cooling ductwork and controls 200. FIG. 2B shows a side view of exemplary cooling ductwork and controls. The ductwork includes supply duct 116 and standpipes 120a, 120b from FIG. 1. Although round ducts are used within this example, any other appropriate shape ducting may be used (i.e. round, rectangular, oval, etc.). In addition, any appropriate HVAC-type materials may be used in the construction of the ducts (i.e., PVDF (PolyVinylidene Fluoride), CPVC (Chlorinated Polyvinyl Chloride), PVC (Polyvinyl Chloride), PB (Polybutylene), PEX (Cross Linked Polyethylene), PE (Polyethylene), sheet metal, etc.).

Dampers 204a, 204b in the top of each of two standpipes 120a, 120b permit control of supply air into the standpipes 120a, 120b. A common take-off duct and elbow 114a supplies each of the standpipes 120a, 120b from supply duct 116. Dampers 204a, 204b are used to trigger the activation of the distribution wands 118 (as shown in FIG. 1). The dampers may have any appropriate type of activation method (i.e. motorized, pneumatic, etc.).

As shown in FIG. 1, standpipe 120a provides cool air to the top nine distribution wands, while standpipe 120b provides cool air to the bottom eight distribution wands within the left datacenter rack 100. In this example, damper 204a would be used to turn air flow on and off to the top eight distribution wands, while damper 204b would be used to turn air flow on and off to the bottom eight distribution wands.

In another implementation, dampers may be provided at the entrance to each distribution wand such that individual wands may be separately triggered to operate. In the circumstance in which some of the trays are not powered up and/or populated, it may be desirable to have control at this finer level to conserve energy. In one implementation, an electrical load sensor may exist within each tray to gauge whether or not the board is presently operational, or to estimate the heat load for the board, and thereby to control supplemental air delivery in addition to, or in place of, a temperature sensor. For example, a board-mounted load sensor within a tray may be used to determine whether or not to engage the cooling wand associated with the tray. Any appropriate method of damper positioning may be implemented to provide the user with the appropriate granularity of control desired. In addition, control of ambient air flow, such as by controlling the speed of fans 11, may also occur in response to signals indicating an electrical load being placed on a tray or group of trays.

In one implementation, dampers 204 may be triggered by a thermostat. As with the dampers, any appropriate number of thermostats may be employed for localized sampling and triggering. The relationship between thermostats and damper controls may be one-to-one or many-to-one, with the average or highest temperature thermostat controlling the damper.

Figure 3A:
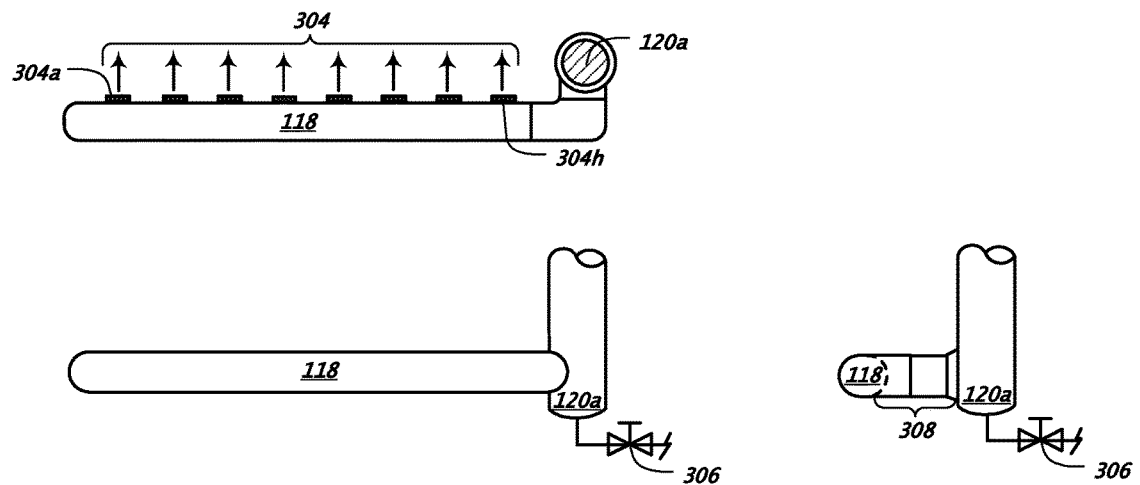
FIG. 3A shows front, top, and side views of an air distribution wand.

FIG. 3A shows front, top, and side views of an air distribution wand such as distribution wand 118 (as shown in FIG. 1). In the upper left view, the top of distribution wand 118 is visible, with a cross-sectional view of the attached standpipe 120a. The distribution wand 118 has an array of air nozzles 304 that point toward a tray that requires cooling. The air nozzles 304, though presented in view 302a as extending from the air distribution wand 118, may be perforations, funnels, check valves, or any other shape of air feed structure that allows air to be blown at a tray. Though the arrows from the nozzles 304 showing air flow are represented as being perpendicular to the distribution wand 118, the individual air flows may instead be non-perpendicular and/or adjustable to target a particular area or a smaller area than the length of the distribution wand 118. In one implementation, the nozzles 304 may comprise outlets similar to the jets found within a whirlpool bath, which may be individually adjusted open or closed and to point downward or upward to concentrate the air flow centrally toward a motherboard within a particular tray. For example, in one implementation, the outer nozzles near and including 304a and 304h may be directed more toward the center of distribution wand 118 to supply cool air to a smaller component set within a corresponding tray.

The lower left view provides a front representation of the distribution wand 118 and its connection to distribution pipe 120a. The wand is shown to be relatively long so as to extend across the width of a computing rack. The air nozzles 304 are opposite to this view of the distribution wand 118. Distribution pipe 120a is connected to a control valve 306 which opens and closes the feed of cooling air to the distribution wand.

A pivoting connection (not shown) may be provided near the base of wand 118 to permit the nozzles 304 to be aimed up or down relative to a tray in front of the wand 118. The pivoting may also be permitted to be at, near, or more than 180 or 360 degrees to permit the nozzles 304 to be aimed away from a tray and back into the workspace of a data center. As such, a worker in the workspace may provide themselves with local cooling, such as when they are performing repair or maintenance work on an adjacent rack or a rack across from the rack associated with wand 118.

In the right-hand view, the elbow of distribution wand 118 and its connection to standpipe 120a are detailed. The distribution wand 118 extends outward perpendicularly from standpipe 120a, and then bends at a right angle to run the length of a corresponding tray. A drain having a shut-off drain valve 306 may also be provided at the bottom of standpipe 120a, such as to permit for the drainage of condensate that may accumulate in standpipe 120a.

When the distribution wand 118 is positioned across a tray, it may block or complicate access to the contents of the tray. It may therefore be difficult if not impossible to remove or otherwise access the tray while distribution wand 118 is in place. In addition, the tray may be provided with connections, such as electrical and networking connections, at its front side so as to make connecting trays easier and less expensive than electrical backplane connections and the like.

Figure 3B:
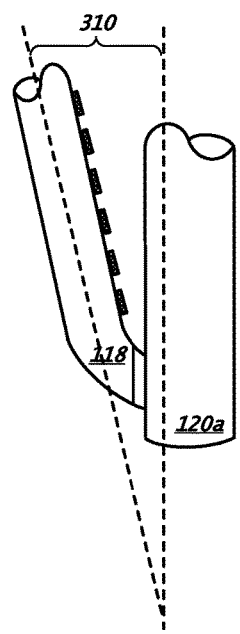
FIG. 3B shows aside view of an air distribution wand in its folded position.

Because of this potential limitation, FIG. 3B illustrates a view in which distribution wand 118 is rotated into a mainly vertical position along standpipe 120a. The distribution wand 118 may attach to the front of the standpipe 120a (as shown in the view) using a rotating elbow joint, or other flexible joining mechanism to permit the distribution wand 118 to pivot from a horizontal to a vertical position. The elbow may cause the distribution wand 118 to angle away from the standpipe 120a at an angle 310 as it is rotated upward, so that wand 118 does not hit the next higher wand (i.e., the higher portions of wand 118 are spaced far enough from standpipe 120a so as to avoid interference with any wands above). While the distribution wand 118 is in its vertical positioning, the user may be allowed easier access to the tray 102. The vertical positioning may be used during removal, replacement, or upgrading of the contents of tray 102, for example.

In addition, the path of travel for the wand 118 may be configured so as to avoid interference between the wand and wires attaching to the front of a tray. The wand 118 or standpipe 120a may also be provided with structures (not shown) on which cable connectors (e.g., power wires and networking cables) may be hung while a tray is being replaced, so as to keep such cables out of the way.

Figure 4:
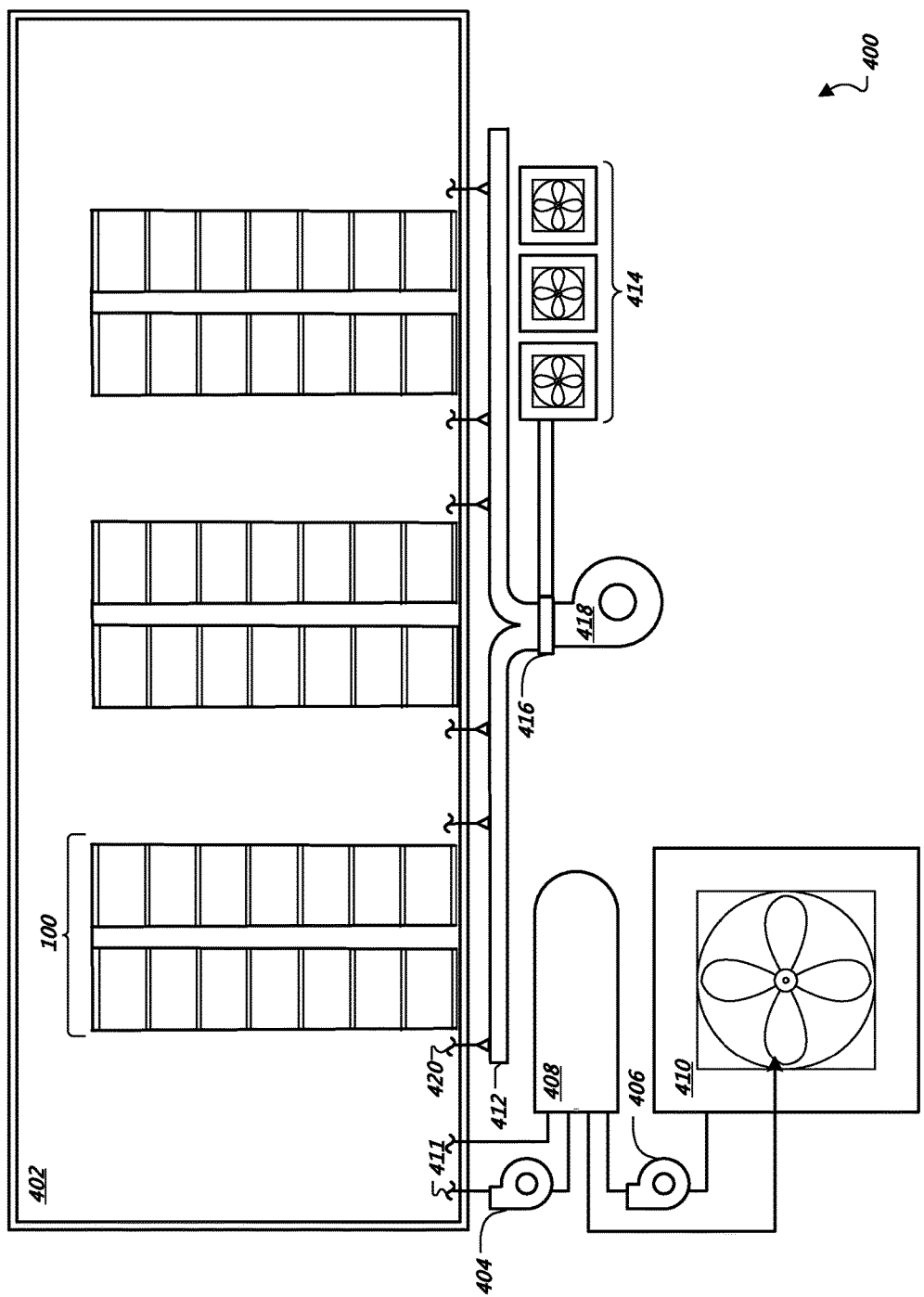
FIG. 4 is a schematic diagram of a cooling system for a data center.

FIG. 4 is a schematic diagram of a cooling system 400 for a data center 402. The cooling system 400 may provide for on demand supplemental cooling air, such as is described above. The data center 402, as shown, is a building that houses a large number of computers or similar heat-generating electronic components. The computers are arranged in a number of parallel rows and mounted in vertical racks, such as the rack system 100 shown in FIG. 1. The racks may include pairs of vertical rails on which are laid trays made up of computer motherboards and associated components.

The cooling system 400 generally includes two systems—a warm-air cooling system and a cold-air cooling system. The warm-air cooling system may provide large volumes of air at a relatively high temperature such as 60 degrees Fahrenheit or more. Such warmer air may be introduced into the ambient workspace of data center 402. The cold-air system may provide smaller volumes of relatively cooler air, such as air at between 30 and 60 degrees Fahrenheit. Such cooler air may be introduced by a separate ducted system, such as that shown in the previous figures.

The warm-air cooling system is shown in the exemplary system 400 as employing a cooling tower 410 in fluid communication with a heat exchanger 408. The water loop between the cooling tower 410 and the heat exchanger 408 may be termed a condenser water loop, and may generally be a loop that is open to the environment at the cooling tower. The heat exchanger may take an appropriate form such as a plate or shell-in-tube heat exchanger. In addition to the heat exchanger 408, a chiller or other similar component (not shown) may be provided, either in series or in parallel, to provide for additional cooling, such as during periods of peak demand (e.g., in warm weather, in the mornings when many people log into the data center to check their e-mail, or in the evening when many people begin watching internet protocol television (IPTV)). A pump 406 drives water through the loop, and water cascades through and evaporates in the cooling tower 410 in a conventional manner to provide cooling for the condenser water.

A closed, cooling water loop may be thermally coupled to the condenser water loop by the heat exchanger 408. Supply pipe 411 may carry cooled water driven by pump 404 into the data center 402, where it may be provided to various air-to-water heat exchangers (not shown). Those air-to-water heat exchangers may be located at each of various racks in the system 400, such as near the back of each rack. The exchangers may also be located between racks and may cool air as it is pushed out from a common warm-air plenum. Alternatively, the exchangers may be located in an attic space of the data center 402, and may receive air from a common warm-air plenum, and provide cooled air through ducts down into the data center workspace. The supply pipe 411 may alternatively be implemented as a sump or elongate trough under the data center 402, and as such may be accessed in various locations throughout the data center 402 to provide greater flexibility in the location of cooling systems in the data center 402.

The cooling tower may be considered a free cooling source, because it requires power only for movement of the water in the system and the powering of a fan to cause evaporation; it does not require operation of a compressor in a chiller or similar structure. In general operation, the system 400 may be run from the cooling tower/heat exchanger/cooling coil system, though a powered cooling system such as a chiller may be provided for peak loads, such as when the ambient dew point is very high and the cooling tower 410 cannot provide sufficient cooling alone.

In one implementation, supply temperatures for cooling water may be 20° C., while return temperatures may be 40° C. In other implementations, temperatures of 10° C. to 29° C. may be selected for supply water, and 15° C. to 80° C. for return water. Chilled water temperatures may be produced at much lower levels according to the specifications for the particular selected chiller. Cooling tower water supply temperatures may be generally about the current wet bulb temperature under ambient atmospheric conditions, while cooling tower return water temperatures will depend on the operation of the system 400.

Supplemental cooling may be provided by the cold-air cooling system. In general, the warm-air cooling system may be sufficient to cool the data center 402 under normal conditions, and may adequately cool in additional conditions if a chiller or similar powered cooling device is added to the warm-air cooling system. However, it may be desirable to provide relatively low air volume cooling in certain situations. For example, certain "hot spots" may arise in data center 402, and engaging a chiller to cool the entire data center may not be economical. Also, short-term periods of high load may also occur, and a cooling system that depends on large volumes of air and cooling water, along with a chiller or similar device, may not be adequately responsive to handle quick changes.

For such situations, the supplemental cooling of the cold-air system may be provided. The exemplary cold-air cooling system shown is a ducted system, using cold-air distribution ducts such as duct 420. Cooling air may be driven through the ducts by fan 418, and through cooling coil 416. The fan 418 may be, for example, a centrifugal or other form of fan or group of fans, and may in appropriate circumstances include a high-pressure fan to supply cold air through data center 402 at relatively high pressures, and to provide for relatively high exit velocities. Though not shown, return ductwork from the interior of data center 402 may also be provided. Appropriately-controlled dampers may also provide control over the supply and mixing of such air, in a customary manner.

A bank of compressor/condensers 414 may be located near or on the roof of the data center 402 in a conventional manner, and may be provided to remove heat from air that is driven by fan 418. Cooling coil 416 may include an evaporator that is mated with the compressor/condensers 414.

In operation, the cold-air cooling system may supply air that is substantially cooler than the higher-volume air provided by the warm-air cooling system.

The cold-air cooling system and the warm-air cooling system may be connected to a common control system and coordinated using conventional techniques. For example, for spot cooling, the cold-air cooling system may simply be engaged when a thermostat associated with a particular tray, rack, or group of racks calls for cooling. The system may then operate, and additional stages of cooling may be added, as additional thermostat call for cooling. The fan 418 may be controlled to maintain a particular pressure in ducts 412 and/or 420, and the bank of compressor/condensers 414 (and associated pumps or other components) may be staged on or off to maintain a particular temperature in the air exiting coil 416. The air may be cooled at or around temperatures like those discussed above with respect to FIG. 1.

In addition, when the warm-air cooling system is sensed to be operating at or near its maximum capability, the cold-air cooling system may also be engaged. In such a situation, all dampers in the cool air distribution system may be opened for free flow of air throughout the system, or individual areas of the cold-air cooling system may be controlled, such as via individual thermostats. Also, areas within data center 402 may be controlled together, such as by providing cooling for one or more entire banks of racks. Such control may occur automatically, or may be manually overridden.

In addition, control of the cooling systems may be integrated with a fire-control system. For example, interlocks may be provided with a smoke detection system to prevent supply of air to a fire, and to permit manual smoke purge operation of the systems.

A number of embodiments have been described. Nevertheless, it will be understood that various modifications may be made without departing from the spirit and scope of the disclosures in this document. For example, additional components may be added to those shown above, or components may be removed or rearranged. Also particular values for temperatures and other such values may be varied. Moreover, steps in processes may be rearranged, added, or removed as appropriate. Accordingly, other embodiments are within the scope of the following claims.

What is claimed is:

1. A data center cooling system, comprising:
a warm-air cooling system configured to cool a flow of ambient air that circulates in a human-occupiable workspace of a data center;
one or more fans positioned to circulate the cooled ambient air directly from the human-occupiable workspace of the data center across a plurality of rack-mounted electronic devices located in a rack that comprises a front that is open to the human-occupiable workspace, the plurality of rack-mounted electronic devices serviceably accessible in the rack, wherein a majority of the rack is open to the human-occupiable workspace through the open front of the rack that is open to the human-occupiable workspace of the data center;
a cold-air cooling system positioned to circulate cooler-than-ambient air to the plurality of rack-mounted electronic devices located in the rack; and
a control system communicably coupled to the first warm-air and cold-air cooling systems and operable to perform operations comprising:
monitoring a temperature at or near a first area of rack-mounted electronic devices of the plurality of rack-mounted electronic devices;
operating the cold-air cooling system to circulate cooler-than-ambient air, through at least one cooler-than-ambient air duct of a plurality of cooler-than-ambient air ducts of the cold-air cooling system, to the first area of rack-mounted electronic devices when the monitored temperature exceeds a threshold temperature; and
operating the warm-air cooling system, during circulation of the cooler-than-ambient air, to cool the ambient air circulated to a second area of rack-mounted electronic devices of the plurality of rack-mounted electronic devices that is different than the first area of rack-mounted electronic devices.

2. The data center cooling system of claim 1, wherein the one or more fans are mounted to one or more of the electronic devices that provide air warmed by the electronic devices to a warm air plenum that is thermally isolated from the human-occupiable workspace.

3. The data center cooling system of claim 2, wherein the warm-air cooling system further comprises a fan unit located in the warm air plenum to circulate the ambient air from the rack to the warm air plenum.

4. The data center cooling system of claim 1, wherein the warm-air cooling system comprises a cooling coil fluidly coupled to a free cooling system, the cooling coil positioned to receive a cooling liquid from the free cooling system and cool warmed air from a warm-air plenum that is thermally separated from the human-occupiable workspace to the ambient air.

5. The data center cooling system of claim 1, wherein the cold-air cooling system comprises a cooling coil fluidly coupled to a powered cooling system, the cooling coil positioned to receive a chilled liquid from the powered cooling system and cool warmed air from a warm-air plenum that is thermally separated from the human-occupiable workspace to the cooler-than-ambient air.

6. The data center cooling system of claim 1, wherein the control system is further operable to perform operations comprising at least one of:
monitoring a temperature of the ambient air circulating near the first area of rack-mounted electronic devices;
monitoring a component case temperature of at least one rack-mounted electronic device of the first area of rack-mounted electronic devices;

monitoring an electrical demand of at least one rack-mounted electronic device of the first area of rack-mounted electronic devices; or monitoring an exhaust air temperature of an airflow leaving a tray that supports at least one rack-mounted electronic device of the first area of rack-mounted electronic devices.

7. The data center cooling system of claim 1, wherein the cold-air cooling system comprises an air distributor that comprises an air outlet positioned at a front of the rack.

8. The data center cooling system of claim 7, wherein the air distributor comprises an air wand pivotally mounted to a riser duct associated with the rack.

9. The data center cooling system of claim 8, wherein the air wand is configured to pivot to direct the cooler-than-ambient air toward the first group area of rack-mounted electronic devices.

10. A method of cooling electronic equipment, comprising:

cooling a flow of ambient air with a warm-air cooling system that comprises an evaporative cooling source;

generating a flow of cooler-than-ambient air with a cold-air cooling system that comprises a compressor-based cooling source;

circulating the cooled ambient air, with one or more fans, directly from a human-occupiable workspace of a data center across a plurality of rack-mounted electronic devices located in a rack that is open, at the front, to the human-occupiable workspace during circulation of the ambient air, the plurality of rack-mounted electronic devices serviceably accessible in the rack, wherein a majority of the rack is open to the human-occupiable workspace through the open front of the rack that is open to the human-occupiable workspace of the data center;

monitoring a temperature at or near a group area of rack-mounted electronic devices of the plurality of rack-mounted electronic devices;

circulating the cooler-than-ambient air, through at least one of a plurality of cooler-than-ambient air ducts of the cold-air cooling system and from a cooler-than-ambient air outlet of the cold-air cooling system positioned to provide the cooler-than-ambient air, to the first area of rack-mounted electronic devices when the monitored temperature exceeds a threshold temperature; and cooling, during circulation of the cooler-than-ambient air, the ambient air circulated to a second area of rack-mounted electronic devices of the plurality of rack-mounted electronic devices that is different than the first group area of rack-mounted electronic devices.

11. The method of claim 10, wherein the one or more fans are mounted to one or more of the electronic devices that provide air warmed by the electronic devices to a warm air plenum that is thermally isolated from the human-occupiable workspace.

12. The method of claim 11, wherein the ambient air is circulated by fan units located in the warm-air plenum.

13. The method of claim 10, wherein the ambient air is supplied through cooling coils that receive warmed air from a common warm-air plenum that is thermally separated from the human-occupiable workspace and that captures warmed air that has been warmed by the plurality of rack-mounted electronic devices.

14. The method of claim 10, wherein monitoring a temperature at or near a first area of devices of the plurality of rack-mounted electronic devices comprises:

monitoring a temperature of the ambient air circulating near the first group area of rack-mounted electronic devices.

15. The method of claim 10, wherein monitoring a temperature at or near a first area of devices of the plurality of rack-mounted electronic devices comprises at least one of:

monitoring a component case temperature of at least one rack-mounted electronic device of the first area of rack-mounted electronic devices; or monitoring an electrical demand of at least one rack-mounted electronic device of the first area of rack-mounted electronic devices.

16. The method of claim 10, wherein monitoring a temperature at or near a first area of devices of the plurality of rack-mounted electronic devices comprises:

monitoring an exhaust air temperature of an airflow leaving a tray that supports at least one rack-mounted electronic device of the first area of rack-mounted electronic devices.

17. The method of claim 10, wherein circulating cooler-than-ambient air from the cooler-than ambient air outlet comprises circulating the cooler-than-ambient air from an air distributor that comprises the cooler-than ambient air outlet positioned at a front of the rack.

18. The method of claim 17, wherein the air distributor comprises an air wand pivotally mounted to a riser duct associated with the rack.

19. The method of claim 18, further comprising pivoting the air wand to direct the cooler-than-ambient air toward the first area of rack-mounted electronic devices.

20. The method of claim 10, wherein the cooler-than-ambient air is introduced into the flow of ambient air at a position of the rack in front of, and at a same vertical level as, the first area of rack-mounted electronic devices.

* * * * *